(12) United States Patent
Luo et al.

(10) Patent No.: US 7,566,609 B2
(45) Date of Patent: Jul. 28, 2009

(54) METHOD OF MANUFACTURING A SEMICONDUCTOR STRUCTURE

(75) Inventors: Zhijiong Luo, Carmel, NY (US); Yung Fu Chong, Singapore (SG); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 425 days.

(21) Appl. No.: 11/164,568

(22) Filed: Nov. 29, 2005

(65) Prior Publication Data

US 2007/0122955 A1    May 31, 2007

(51) Int. Cl.
*H01L 21/8238*    (2006.01)
(52) U.S. Cl. ................. 438/222; 438/300; 257/E21.431
(58) Field of Classification Search .................. 438/222, 438/226, 300; 257/E21.431
See application file for complete search history.

(56) References Cited

U.S. PATENT DOCUMENTS

| | | | |
|---|---|---|---|
| 6,165,826 A * | 12/2000 | Chau et al. .................. 438/231 |
| 6,207,977 B1 | 3/2001 | Augusto |
| 6,214,679 B1 | 4/2001 | Murthy et al. |
| 6,235,568 B1 | 5/2001 | Murthy et al. |
| 6,342,421 B1 | 1/2002 | Mitani et al. |
| 6,376,323 B1 | 4/2002 | Kim et al. |
| 6,388,296 B1 | 5/2002 | Hsu |
| 6,611,029 B1 | 8/2003 | Ahmed et al. |
| 6,621,131 B2 * | 9/2003 | Murthy et al. ............... 257/408 |
| 6,703,648 B1 | 3/2004 | Xiang et al. |
| 6,777,759 B1 | 8/2004 | Chau et al. |
| 6,787,864 B2 | 9/2004 | Paton et al. |
| 6,797,556 B2 | 9/2004 | Murthy et al. |
| 6,800,530 B2 | 10/2004 | Lee et al. |
| 6,815,770 B1 | 11/2004 | Chien et al. |
| 6,849,527 B1 | 2/2005 | Xiang |
| 6,853,020 B1 | 2/2005 | Yu et al. |
| 6,872,642 B2 | 3/2005 | Oda et al. |
| 7,067,379 B2 * | 6/2006 | Wen et al. .................... 438/300 |
| 2004/0061191 A1 | 4/2004 | Paton et al. .................. 257/412 |
| 2004/0070421 A1 | 4/2004 | Kapoor .......................... 326/38 |
| 2005/0020020 A1 | 1/2005 | Collaert et al. .............. 438/300 |
| 2005/0029601 A1 | 2/2005 | Chen et al. ................... 257/369 |
| 2005/0037558 A1 | 2/2005 | Gong et al. .................. 438/197 |
| 2005/0051851 A1 | 3/2005 | Chen et al. ................... 257/369 |
| 2005/0054164 A1 | 3/2005 | Xiang ........................... 438/285 |
| 2005/0090082 A1 | 4/2005 | Sridhar et al. ............... 438/508 |

* cited by examiner

*Primary Examiner*—Chandra Chaudhari
(74) *Attorney, Agent, or Firm*—Ohlandt, Greeley, Ruggiero & Perle, L.L.P.; Steven Capella, Esq.

(57) ABSTRACT

There is provided a method of manufacturing a field effect transistor (FET) that includes the steps of forming a gate structure on a semiconductor substrate, and forming a recess in the substrate and embedding a second semiconductor material in the recess. The gate structure includes a gate dielectric layer, conductive layers and an insulating layer. Forming said gate structure includes a step of recessing the conductive layer in the gate structure, and the steps of recessing the conductive layer and forming the recess in the substrate are performed in a single step. There is also provided a FET device.

13 Claims, 12 Drawing Sheets

METHOD OF MANUFACTURING A SEMICONDUCTOR STRUCTURE

BACKGROUND OF THE INVENTION

1. Field of the Invention

The present invention relates to semiconductor devices. More particularly, the present invention relates to field effect transistors such as metal-oxide-semiconductor field effect transistors.

2. Description of the Related Art

Both fully silicided (FUSI) gate structures and embedded silicon germanium (eSiGe) structures have shown usefulness in enhancing the performance of field effect transistors (FET), particularly MOSFET (Metal-Oxide-Semiconductor Field Effect Transistor). However, techniques for manufacturing both FUSI and eSiGe structures involve processes that are highly complex when compared to typical CMOS (Complementary Metal Oxide Semiconductor) manufacturing processes.

In addition to typical CMOS processes, fully siliciding the gates of a FET requires additional etching steps, and may require additional chemical mechanical polishing (CMP) steps as well. For example, current FUSI manufacturing techniques require steps of etching and polishing the conductive gate layers prior to silicidation.

Likewise, embedded silicon germanium (eSiGe) structures require additional manufacturing steps. In addition to processes required to form recesses in the FET source and drain regions, and processes to grow the embedded SiGe regions in the recesses, the eSiGe process requires additional steps in order to protect the gates during growth of the eSiGe region.

SUMMARY OF THE INVENTION

It is an object of the present invention to provide an improved method of manufacturing field effect transistors (FET).

It is another object of the present invention to provide a method of manufacturing field effect transistors (FET) that requires fewer steps than current methods.

These and other objects and advantages of the present invention are achieved by a method of manufacturing a field effect transistor (FET) that includes the steps of forming a gate structure on a semiconductor substrate, and forming a recess in the substrate and embedding a second semiconductor material in the recess. The gate structure includes a gate dielectric layer, conductive layers and an insulating layer. Forming said gate structure includes a step of recessing the conductive layer in the gate structure, and the steps of recessing the conductive layer and forming the recess in the substrate are performed in a single step. There is also provided a FET device.

DESCRIPTION OF THE INVENTION

The present invention provides a method of manufacturing a field effect transistor (FET) that includes the steps of forming a gate structure on a semiconductor substrate, and forming a recess in the substrate and embedding a second semiconductor material in the recess. The gate structure includes a gate dielectric layer and a conductive layer. In one embodiment, the method also includes forming a gate structure having a sandwiched insulating layer between a first and a second conductive layer, and this insulating layer serves as an etching stopper. Forming the gate structure includes a step of recessing the conductive layer in the gate structure. The steps of recessing the conductive layer and forming the recess in the substrate are performed in a single step. There is also provided a FET device. In one embodiment, the steps of recessing said conductive layer and forming a recess in the substrate are performed substantially simultaneously.

In another embodiment, the method further includes applying a metal material to the conductive layer of the gate and to a source region and a drain region of the substrate. A silicide is then formed on the gate, the source region, and the drain region. The resultant gate is a fully silicided gate.

In another embodiment, the present invention provides a field effect transistor (FET) device including a semiconductor substrate, a first gate and a second gate. The first gate is located on a first semiconductor substrate region having a first source region and a first drain region proximate to the first gate. The second gate is located on a second semiconductor substrate region having a second source region and a second drain region proximate to the second gate. The FET device also includes a semiconductor region embedded into the first semiconductor substrate region or the second semiconductor substrate region. The first source and drain regions, and the second source and drain regions, are silicided. The first gate and the second gate are fully silicided.

Figure 10:
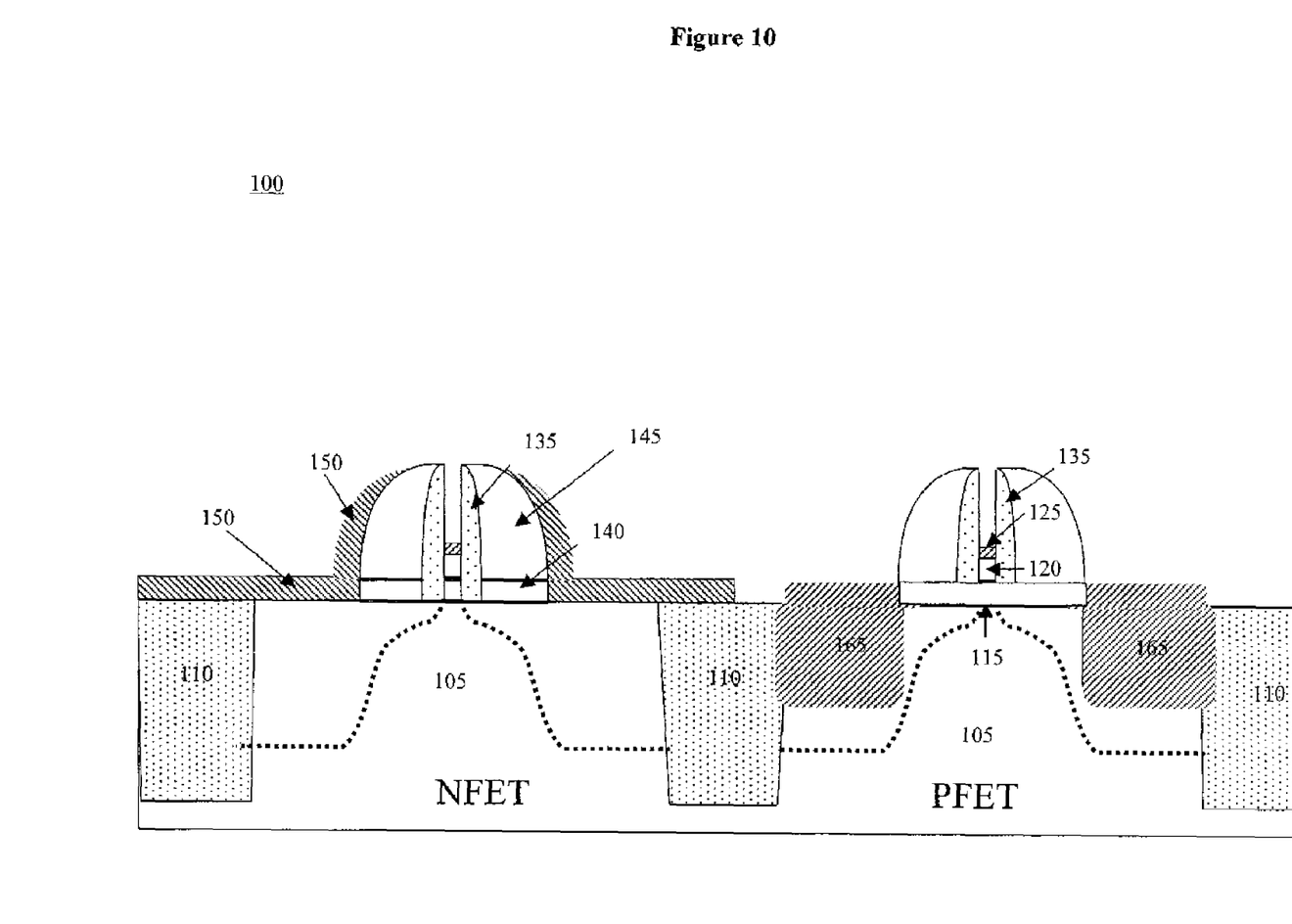
FIG. 10 is a cross-sectional view of a tenth step of the method of the present invention.
Figure 11:
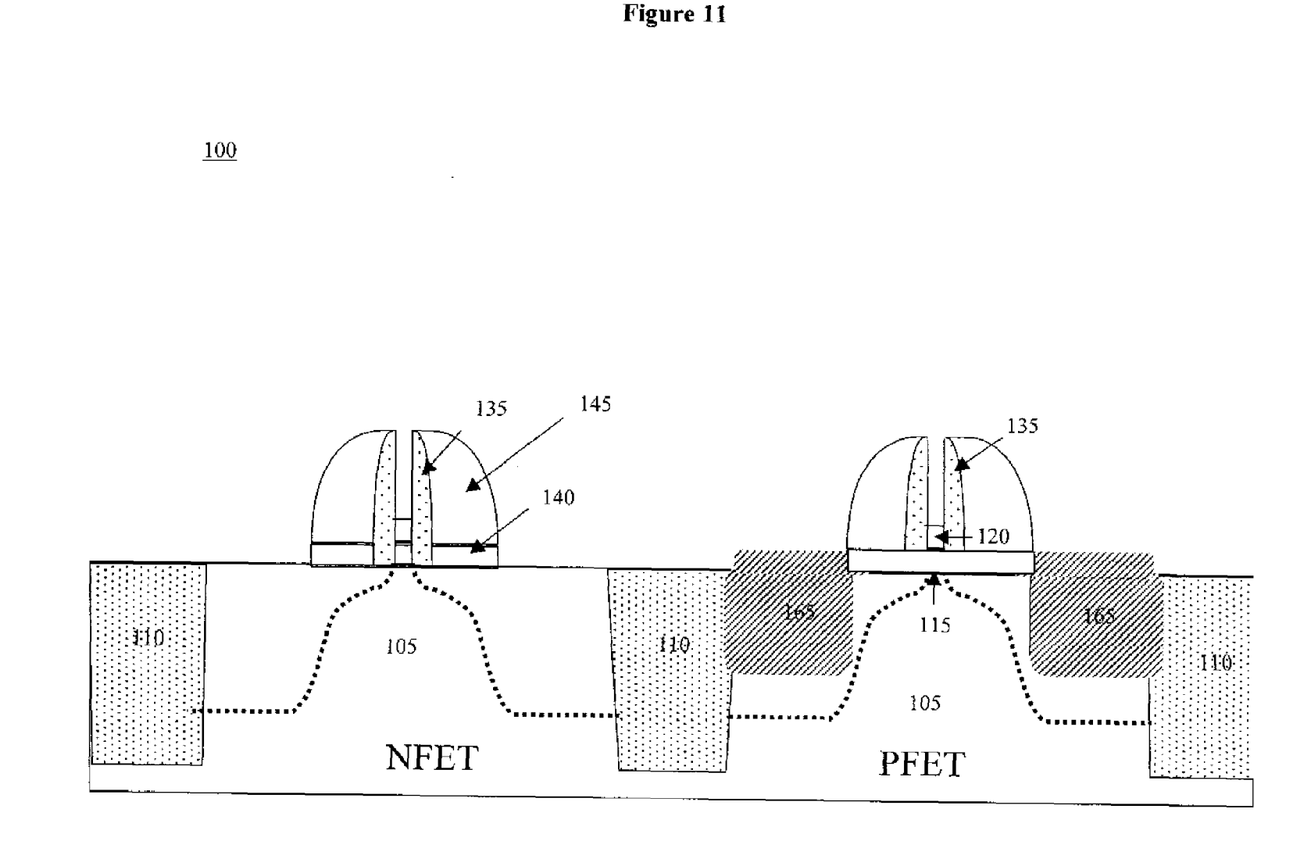
FIG. 11 is a cross-sectional view of an eleventh step of the method of the present invention.
Figure 12:
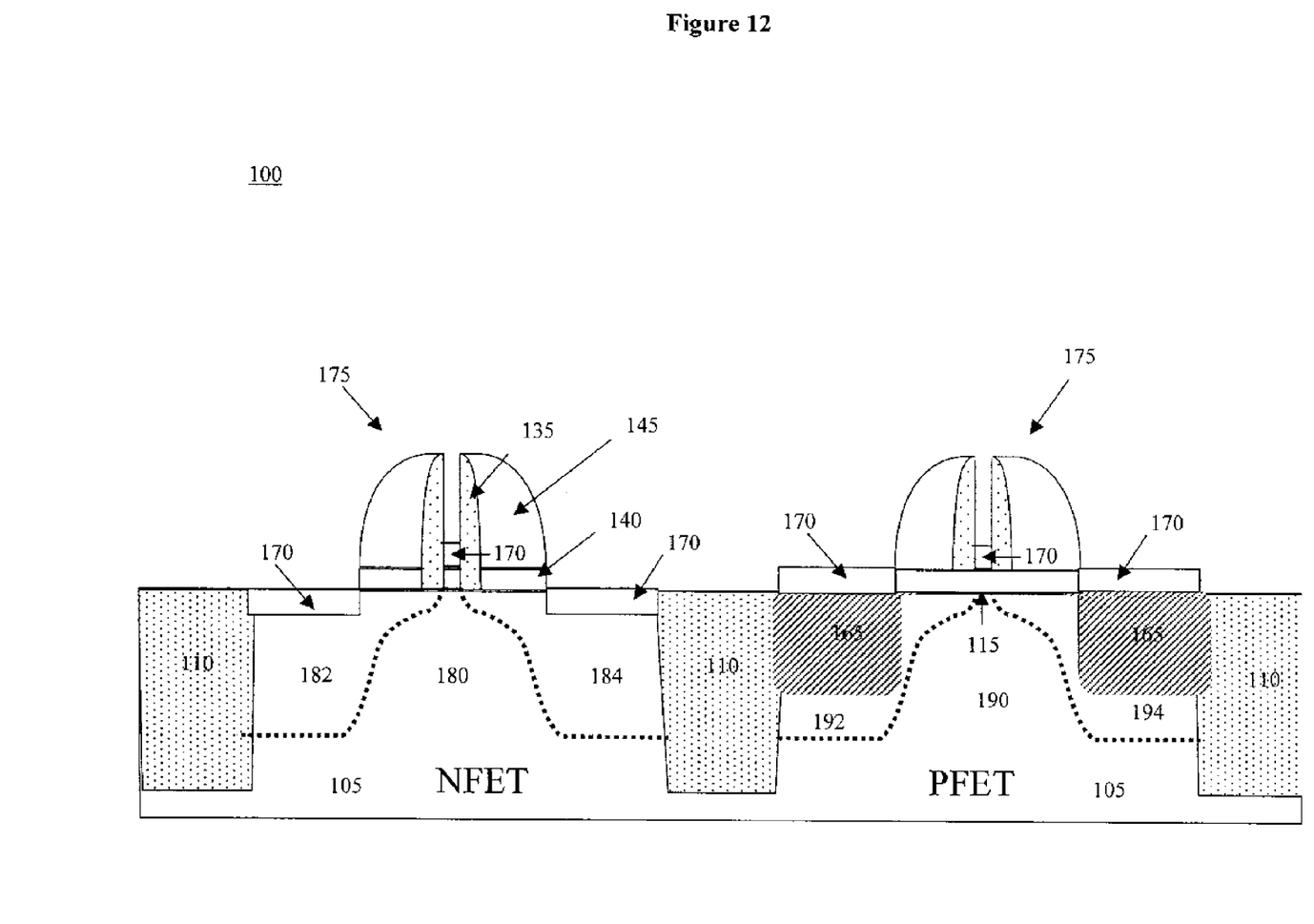
FIG. 12 is a cross-sectional view of a twelfth step of the method of the present invention.

Referring to the drawings and, in particular, FIGS. 1-12, there is provided a method of manufacturing a Field Effect Transistor structure (FET) of the present invention. The resultant FET manufactured by the method is shown in FIG. 12 and is generally represented by reference numeral 100.

FET 100 is preferably a Metal-Oxide-Semiconductor Field Effect Transistor (MOSFET) structure. The FET transistor can be a n-type FET transistor or a p-type FET transistor.

Figure 1:
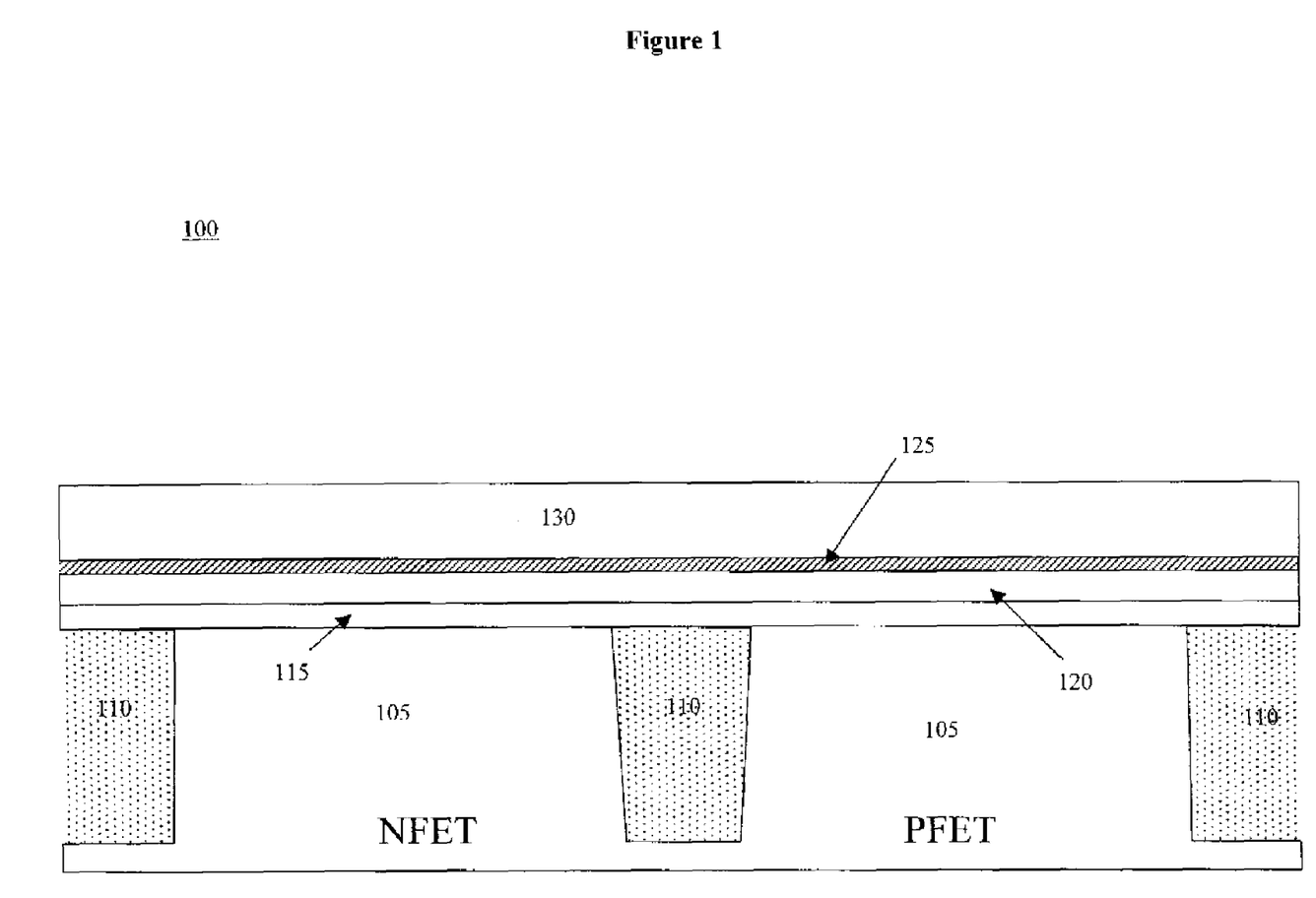
FIG. 1 is a cross-sectional view of a first step of the method of the present invention.

Referring to FIGS. 1-12, in one embodiment, FET 100 is a MOSFET 100, and is manufactured on a substrate 105, as shown in FIG. 1. Substrate 105 is preferably made from silicon, but may also be made from a silicon substrate on an insulating layer. Substrate 105 may also be made from a semiconducting material or a semiconducting layer on an insulator. In one embodiment, MOSFET 100 is a structure having both an n-type FET (NFET) and a p-type FET (PFET).

Substrate 105 may include n-doped silicon for constructing a PFET, and/or p-doped silicon for constructing a NFET. Substrate 105 is partitioned via STI, i.e., shallow trench isolation, by structures 110, which isolate each FET in substrate 105. Structures 110 may be made from materials such as silicon nitride or silicon oxide.

Referring to FIG. 1, a gate dielectric 115 is deposited on substrate 105 and structures 110. Gate dielectric 115 is preferably made from a suitable dielectric material including oxides such as $SiO_2$, SiON, $Si_3N_4$, $HfO_2$, $ZrO_2$, $Al_2O_3$, $TiO_2$, $La_2O_3$, $SrTiO_3$, $LaAlO_3$, or any combinations thereof. A first conductive layer 120 is deposited on gate dielectric 115. A thin insulating layer 125 is deposited on first conductive layer 120, and a second conductive layer 130 is deposited on insulating layer 125. Layer 125 is preferably made from silicon nitride, but may also be made from other materials such as silicon oxide and other insulating materials such as $ZrO_2$, $Al_2O_3$, $TiO_2$, $La_2O_3$, $SrTiO_3$, and $LaAlO_3$. Conductive layers 120 and 130 are preferably made from a suitable conductive material such as a polycrystalline silicon (poly-Si) or metal. In another preferred embodiment, the poly-Si material is n-type doped for field effect transistors with an n-type channel (nFET) and p-type doped for field effect transistors with a p-type channel (pFET).

Figure 2:
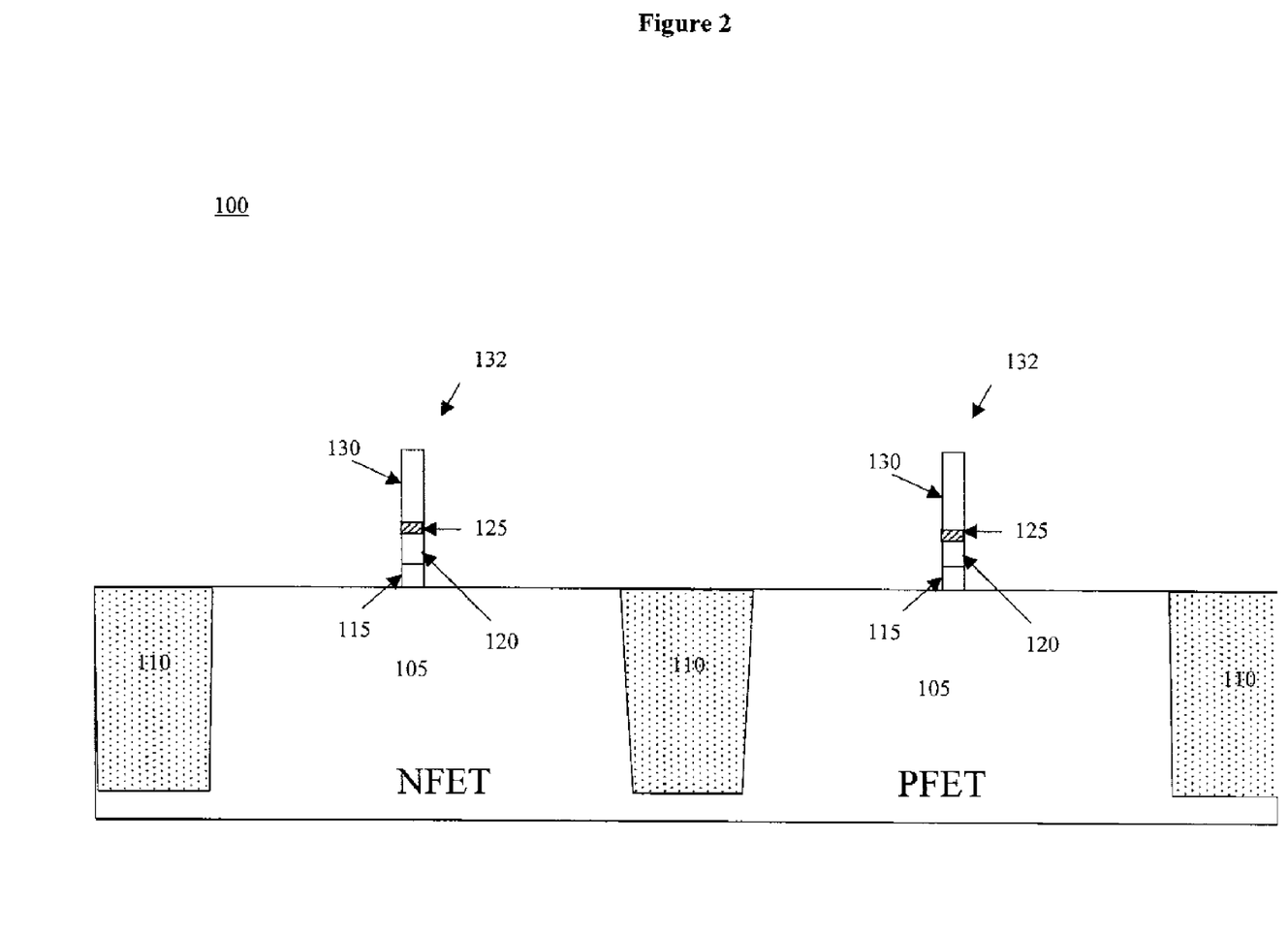
FIG. 2 is a cross-sectional view of a second step of the method of the present invention.

Referring to FIG. 2, conductive layers 120 and 130 are pre-doped, as necessary, with an n-type dopant such as As, P and Sb for NFET regions, and a p-type dopant, such as Boron and $BF_2$, for PFET regions. Gate dielectric 115 and layers 120, 125 and 130 are etched to form gate stacks 132.

Figure 3:
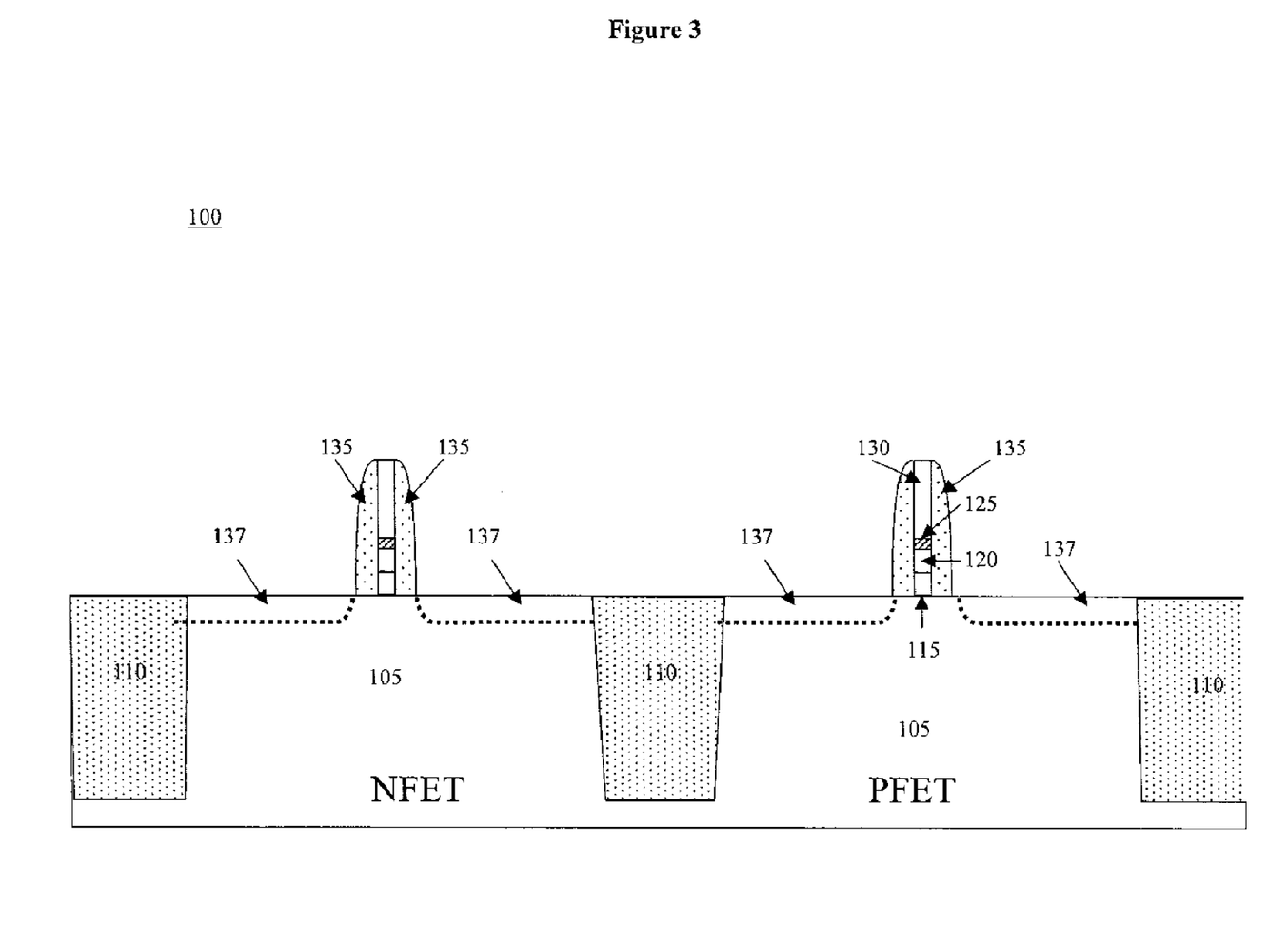
FIG. 3 is a cross-sectional view of a third step of the method of the present invention.

Referring to FIG. 3, first spacers 135 are formed on the sidewalls of gate stacks 132. First spacers 135 may be formed by any suitable method, such as deposition and etching. In one embodiment, spacers 135 are formed by using a thermal-oxidation process or a low-temperature oxide (LTO) deposition and etching process. First spacers 135 are preferably made from a silicon oxide or silicon nitride material. Also, halo and/or extension implantation may be employed to form n and/or p regions 137 in substrate 105.

Figure 4:
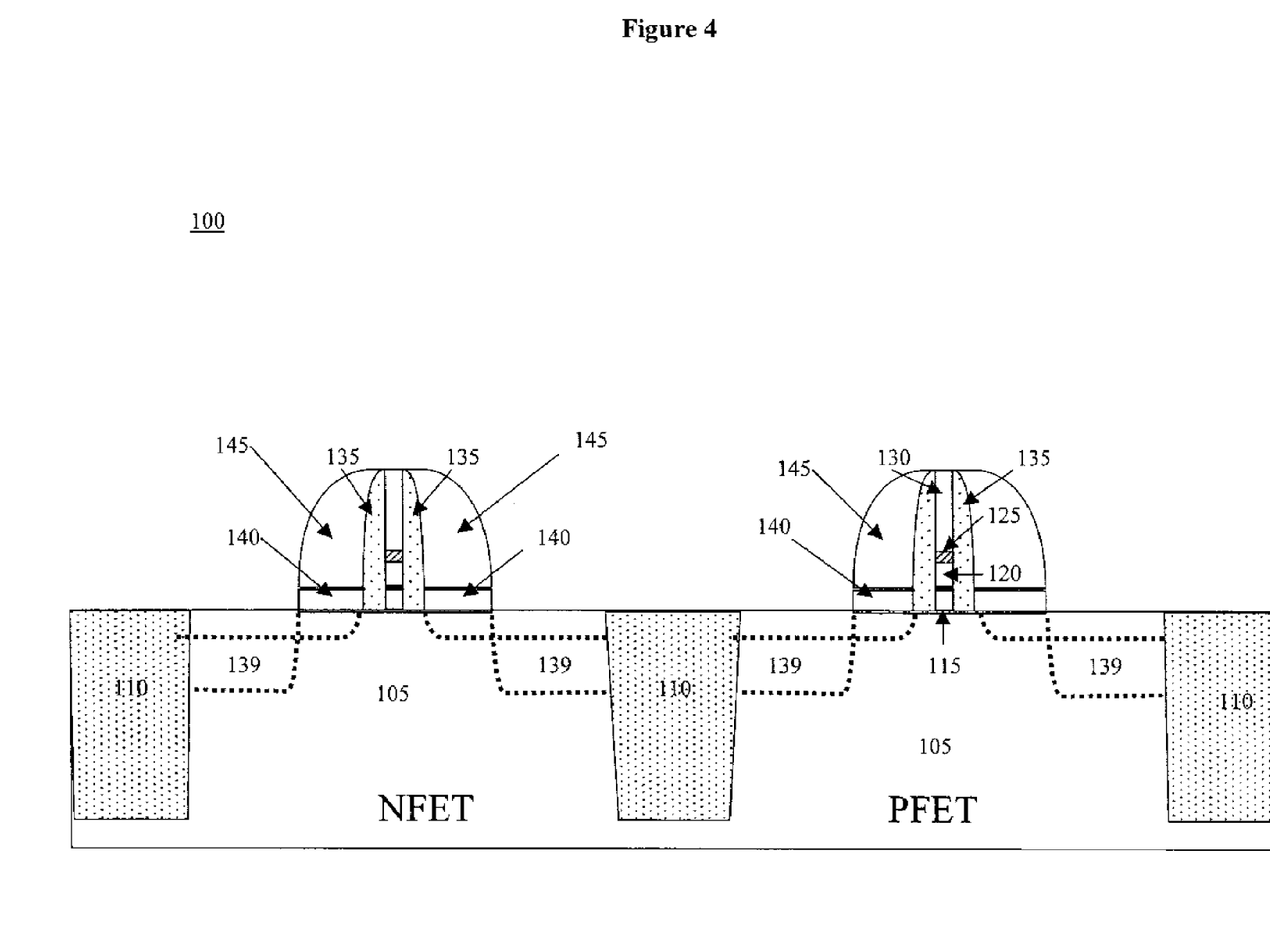
FIG. 4 is a cross-sectional view of a fourth step of the method of the present invention.

Referring to FIG. 4, second spacers 145, along with buffer silicon oxide layers 140, are formed on substrate 105 and surrounding first spacers 135. Second spacers 145 are preferably made from a silicon nitride material. Spacers 145 and buffer silicon oxide layers 140 are preferably formed by deposition followed by an etching process. After forming spacers 145, ion implantation may also be performed to create n and/or p source and drain regions 139 in substrate 105 for both NFET and PFET.

Figure 5:
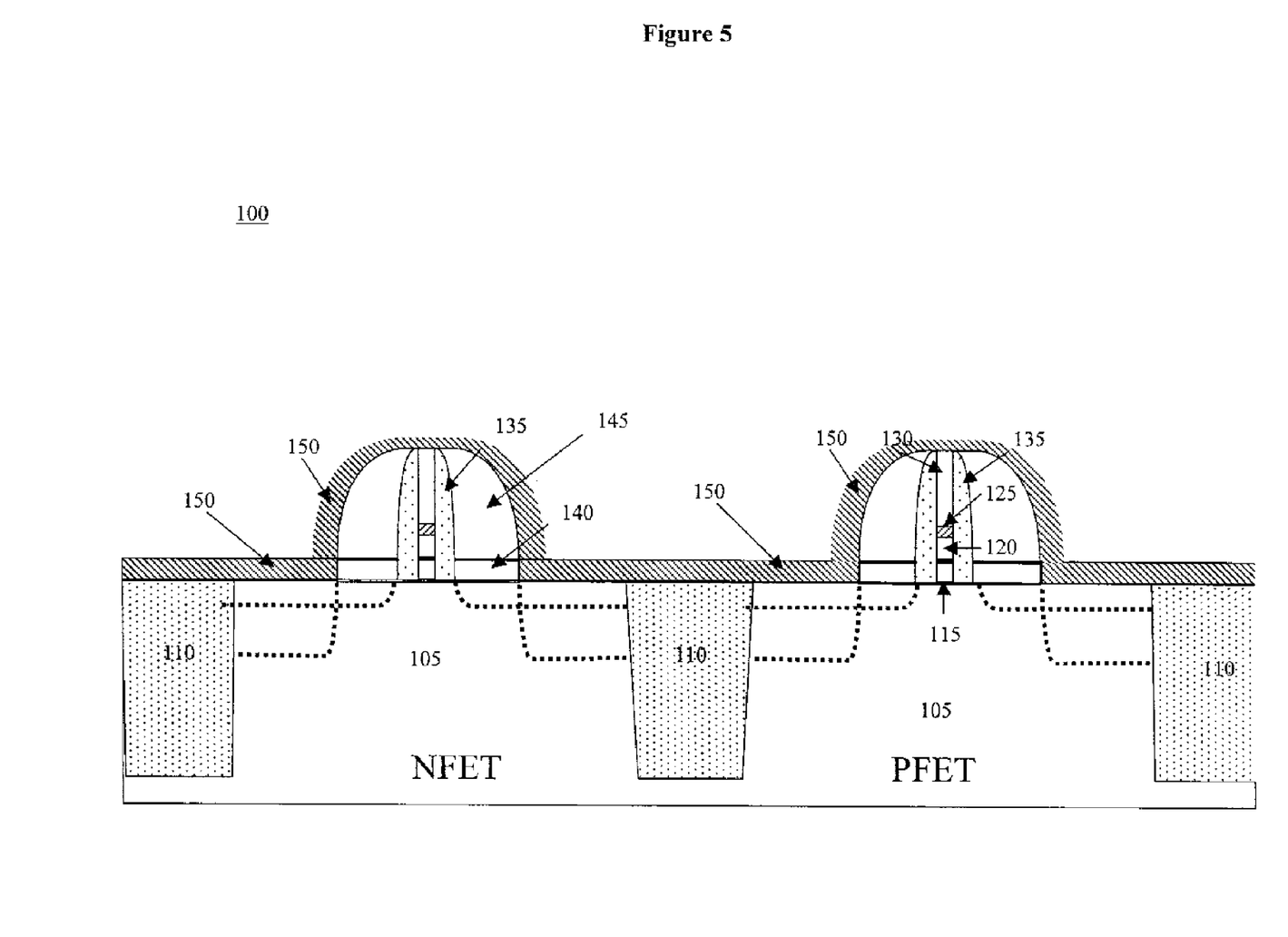
FIG. 5 is a cross-sectional view of a fifth step of the method of the present invention.
Figure 6:
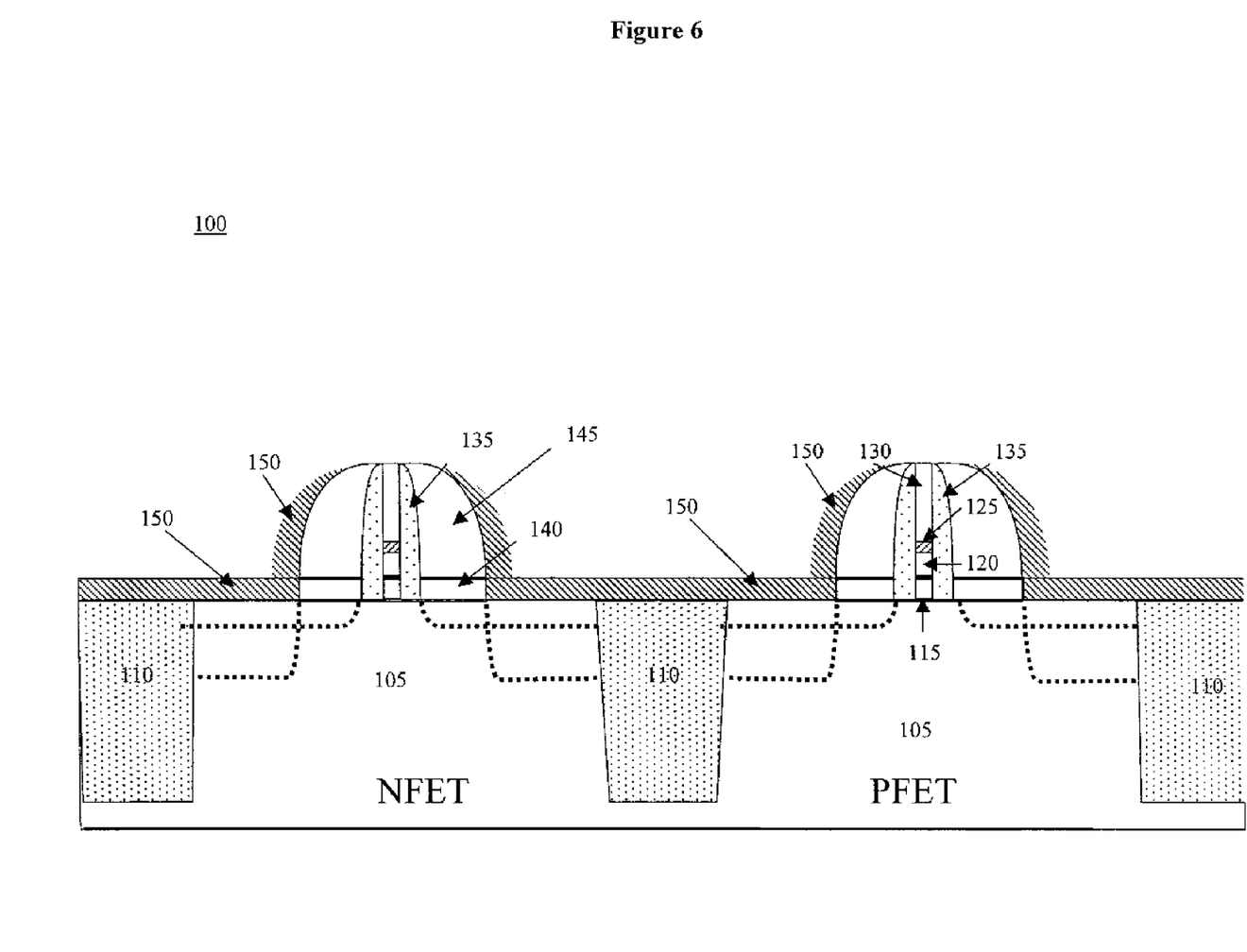
FIG. 6 is a cross-sectional view of a sixth step of the method of the present invention.

Referring to FIG. 5, an additional layer of non-conformal oxide 150 is deposited on spacers 145 and substrate 105. Referring to FIG. 6, a portion of oxide layer 150 is removed to expose the tops of gate stacks 132. This removal is preferably accomplished by a reactive ion etching (RIE) back process.

Figure 7:
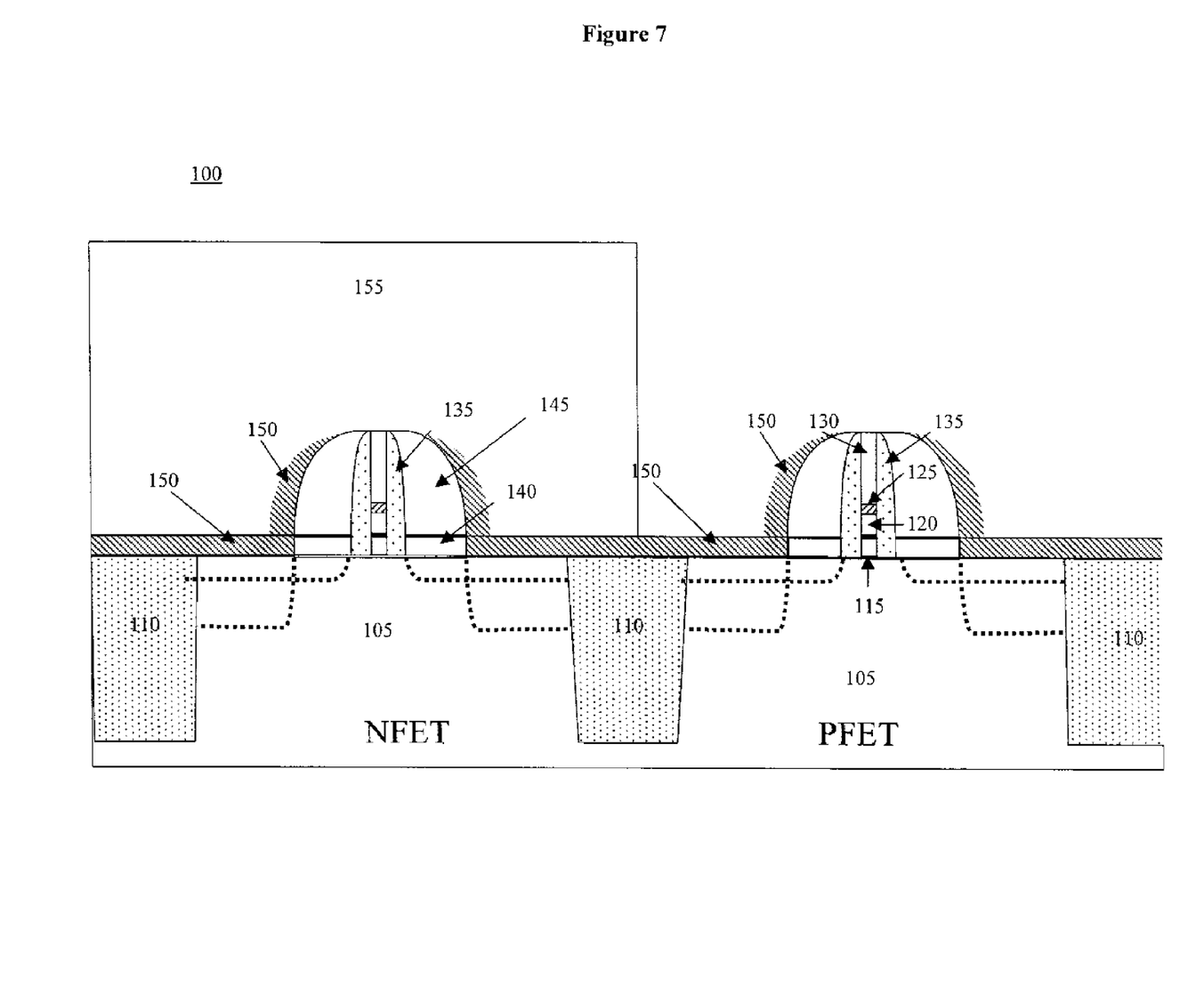
FIG. 7 is a cross-sectional view of a seventh step of the method of the present invention.
Figure 8:
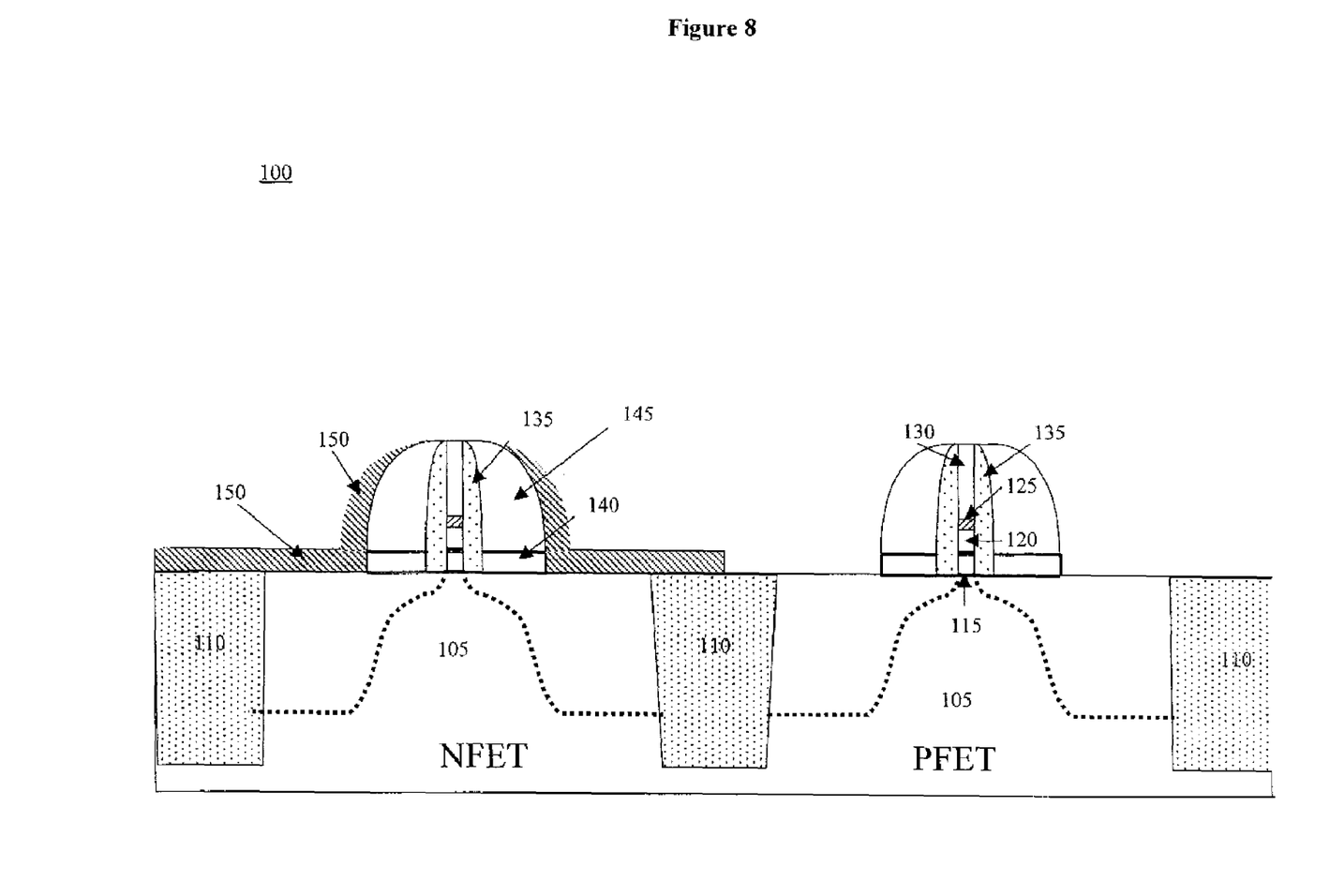
FIG. 8 is a cross-sectional view of an eighth step of the method of the present invention.

Referring to FIG. 7, a resist 155 is provided over the NFET portion of FET 100. Referring to FIG. 8, the PFET portion of oxide layer 150 is removed, preferably by wet etching. Resist 155 is then removed.

Figure 9:
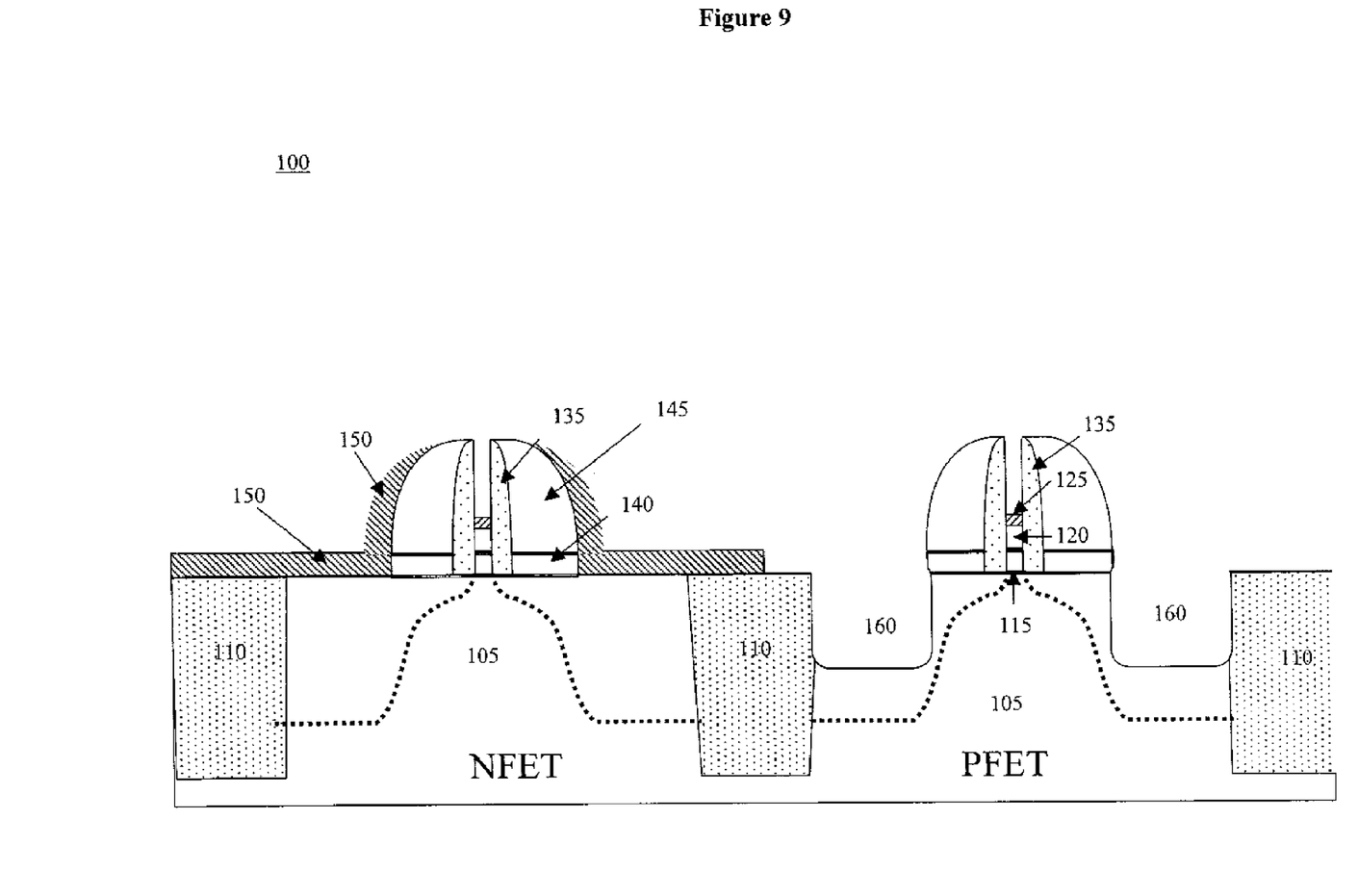
FIG. 9 is a cross-sectional view of a ninth step of the method of the present invention.

Referring to FIG. 9, recesses 160 are formed in the PFET portion of substrate 105. Second conductive layer 130 is also removed, preferably by dry etching, to expose the top of insulating layer 125. Preferably, both the removal of the second conductive layer 130, and recesses 160 are formed in the same etching step.

Insulating layer 125, which is preferably a silicon nitride layer, in this embodiment, prevents etching of first conductive layer 120. The presence of insulating layer 125 allows for the simultaneous, or substantially simultaneous, removal of second conductive layers 130 and formation of recesses 160. Layer 125 also results in a uniform height of the portion of gate stack 132 remaining after etching. Layer 125 also allows the recess depth of recess region 160 on substrate 105 to be larger than the depth of etching of gate stack 132 that results from the simultaneous etching, or etching in a single step, of gate stack 132 and recess 160.

Referring to FIG. 10, doped SiGe (silicon germanium) is grown in recesses 160 to form SiGe regions 165. Referring to FIG. 11, the NFET portion of oxide layer 150 is removed. Insulating layer 125 is also removed.

Referring to FIG. 12, the results of a silicidation process is shown, resulting in a completed FET 100. In this process a metal layer (not shown) is formed on gates 175 and on both the source and the drain regions of substrate 105. Preferred metals include nickel (Ni), cobalt (Co), and Tungsten. The metal is then annealed at an elevated temperature, for example at greater than 300° C., so that the metal will react to the poly-Si of conductive layers 120 in the gate, to the substrate, and to the doped silicon in the substrate to form a silicide layer 170. By adjusting the thickness of the first conductive layer 120 and the thickness of the metal layer, the remaining gate can be fully silicided. The remaining metal layer is then removed, preferably by a wet etch technique. FET 100 is thus a fully silicided (FUSI) gate device.

In an alternative embodiment, insulating layer 125 is not removed prior to silicidation of the source and drain regions. In this embodiment, the source and drain regions are silicided as described above. Then, insulating layer 125 is removed, followed by silicidation of conductive layers 120. This embodiment allows different materials to be used for silicidation of gates 175 relative to the source and drain regions.

The resulting FET is shown in FIG. 12. FET 100 includes gates 175 formed on substrate 105. Gates 175 include buffer silicon oxide layers 140 and spacers 135 and 145. Gates 175 also include gate dielectric 115 and first conductive layer 120, which after silicidation, is now fully silicided layer 170. The NFET portion of substrate 105 includes a central p-doped region 180, a n-doped source region 182, and a n-doped drain region 184. The PFET portion of substrate 105 includes a central n-doped region 190, a p-doped source region 192, a p-doped drain region 194, and embedded eSiGe region 165.

Deposition of various layers described above can be accomplished in any known manner suitable for constructing semiconductor devices. Examples of suitable deposition techniques include chemical vapor deposition (CVD), plasma-enhanced CVD (PECVD), atomic layer deposition (ALD), and high density plasma deposition (HDP). In addition, etching of various layers described above can be accomplished by any suitable known method. In one embodiment, etching is accomplished by a reactive ion etching technique (RIE).

In another embodiment of the present invention, layer 125 is not included in the method. In this embodiment, a single thick conductive layer is deposited on dielectric layer 115, which is later etched away during the step of forming recesses 160.

In the embodiment shown in FIG. 12, the embedded semiconductor region of FET 100 is shown as SiGe regions 165 embedded in the PFET region. In yet another embodiment, the embedded semiconductor region may be formed in the NFET region. In this embodiment, silicon carbide (SiC) is a preferred material for the embedded semiconductor region. The steps of the method used to produce a FET having an embedded region in the NFET region are similar to the steps described above. However, in this embodiment, the step of forming recesses is performed in the NFET region instead of the PFET region, and silicon carbide is preferably embedded in the recesses in the NFET region.

The resulting FET in this embodiment is similar to the FET of FIG. 12. However, in this embodiment, the NFET portion of the substrate includes a central p-doped region 180, a n-doped source region 182, a n-doped drain region 184, and an embedded SiC region. The PFET portion of the substrate includes a central n-doped region, a p-doped source region and a p-doped drain region 194. The PFET portion in this embodiment can have an embedded SiGe region as well.

The method of the present invention provides FET structures having both FUSI and embedded semiconductor features, while requiring fewer steps than typical processes for forming such structures. For example, the method provides that the conductive layer in the gates can be recessed, and the recesses for embedding the SiGe region can be formed, during the same step. This feature reduces the number of steps needed to construct an FET device, particularly one that includes both FUSI gates and eSiGe. The use of one simple recess step as described above also avoids the disadvantages of CMP and etch-back processes.

In addition, this method eliminates the need to protect the gates, particularly the gate over the PFET region, which also greatly simplifies the process of manufacturing such FET structures.

In one embodiment, an insulating layer is deposited between a first and second conductive layer. The insulating layer allows the method to control the thickness of the final conductive layer in the gates at an initial step. In prior methods, a conductive layer must be deposited at a thickness greater than the thickness of the conductive layer of the final gate, and then etched and polished to the desired thickness after the gates are formed. In the present invention, the first conductive layer may be deposited to the desired final thickness. The insulating layer protects the first conductive layer as the second conductive layer is etched away and recesses are formed. Thus, the steps of etching and polishing the gates' conductive layer can be eliminated in the present invention.

The exemplary embodiments of the MOSFET device of the present invention are provided to demonstrate the aspects of the present invention. The present invention is not limited to the MOSFET transistors described above. Variations to the configuration, such as the size and position of the gate, source and drain, fall within the scope of the invention.

It should be understood that various alternatives, combinations and modifications of the teachings described herein could be devised by those skilled in the art. The present invention is intended to embrace all such alternatives, modifications and variances that fall within the scope of the appended claims.

What is claimed is:

1. A method for manufacturing a field effect transistor (FET) device, comprising the steps of:
    forming a gate structure on a semiconductor substrate, wherein said gate structure includes a gate dielectric layer, a first conductive layer, an insulating layer on said first conductive layer, and a second conductive layer on said insulating layer; and
    forming a recess in said semiconductor substrate and removing the second conductive layer to expose a top of said insulating layer in a single etching step.

2. The method of claim 1, further comprising embedding a second semiconductor material in said recess, wherein said second semiconductor material is selected from the group consisting of silicon germanium (SiGe) and silicon carbide (SiC).

3. The method of claim 1, wherein said FET is a Metal-Oxide-Semiconductor Field Effect Transistor (MOSFET).

4. The method of claim 1, wherein said substrate is selected from the group consisting of a silicon substrate, a silicon substrate on an insulating layer, a semiconducting layer, and a semiconducting layer on an insulator.

5. The method of claim 1, wherein said FET includes a NFET and a PFET region, and wherein said recess in said substrate is formed in a region selected from said NFET region and said PFET region.

6. The method of claim 2, wherein said recess in said substrate is formed in said PFET region, and said second conductor material is silicon germanium (SiGe).

7. The method of claim 2, wherein said recess in said substrate is formed in said NFET region, and said second conductor material is silicon carbide (SiC).

8. A method for manufacturing a field effect transistor (FET) device, comprising the steps of:
    forming a gate structure on a semiconductor substrate, wherein said gate structure includes a gate dielectric layer and a conductive layer; and
    forming a recess in said substrate and embedding a second semiconductor material in said recess,
    wherein forming said gate structure includes a step of recessing said conductive layer in said gate structure, and
    wherein said steps of recessing said conductive layer and forming a recess in said substrate are performed in a single step, wherein said forming said gate structure includes the following steps:
    depositing a gate dielectric layer on said substrate;
    depositing a first conductive layer on said gate dielectric layer;
    depositing an insulating layer on said first conductive layer;
    depositing a second conductive layer on said insulating layer;
    etching said gate dielectric layer, said first and second conductive layers, and said insulating layer to form a gate stack; and
    forming one or more spacers around said gate stack,
    wherein said step of recessing said conductive layer is accomplished by recessing said second conductive layer.

9. The method of claim 8, further comprising the step of removing said insulating layer after recessing said second conductive layer.

10. The method of claim 1, further comprising:
    removing said insulation layer;
    applying a metal material to said first conductive layer of said gate and to a source region and a drain region of said substrate; and
    forming a silicide on said gate, said source region, and said drain region, so that said gate is fully silicided.

11. The method of claim 8, wherein said insulating layer prevents said first conductive layer from being etched away during recessing of said second conductive layer.

12. A method for manufacturing a fully silicided (FUSI) field effect transistor (FET) device having an embedded semiconductor region, comprising the steps of:
    depositing a first conductive layer and a gate dielectric layer on a substrate having a NFET region and a PFET region;
    depositing an insulating layer on said first conductive layer;
    depositing a second conductive layer on said insulating layer;

etching said gate dielectric layer, said first and second conductive layers, and said insulating layer to form a first gate stack and a second gate stack, and forming one or more spacers around said first and second gate stacks to form a first gate and a second gate;

removing said second conductive layer from said first gate and said second gate, and forming a recess in said substrate in a source region and a drain region proximate to said first gate, in a single step;

embedding a semiconducting material in said recess removing said insulating layer from said first and second gates; and fully siliciding said first gate, said second gate, said source region and said drain region proximate to said first gate, and a source region and a drain region proximate to said second gate.

13. The method of claim 12, wherein said first gate is located on a region selected from the group consisting of:

said PFET region, wherein said embedded semiconducting material is silicon germanium; and said NFET region, wherein said embedded semiconducting material is silicon carbide.

* * * * *